United States Patent [19]

Lee

[11] Patent Number: 4,484,152
[45] Date of Patent: Nov. 20, 1984

[54] PHASE-LOCKED LOOP HAVING IMPROVED LOCKING CAPABILITIES

[75] Inventor: Ronald L. Lee, Reno, Nev.

[73] Assignee: Westinghouse Electric Corp., Pittsburgh, Pa.

[21] Appl. No.: 379,810

[22] Filed: May 19, 1982

[51] Int. Cl.³ .............................................. H03L 7/10
[52] U.S. Cl. .................................... 331/1 A; 331/12; 331/14; 331/17; 331/25
[58] Field of Search .................................... 331/10–12, 331/14, 17, 25, 1 A, 27

[56] References Cited

U.S. PATENT DOCUMENTS

| | | | |
|---|---|---|---|
| 3,660,781 | 5/1972 | Tewsbury et al. | 331/11 X |
| 4,069,462 | 1/1978 | Dunn | 331/11 |
| 4,135,166 | 1/1979 | Marchetti | 331/14 |
| 4,205,277 | 5/1980 | Poinas | 331/12 |

*Primary Examiner*—Siegfried H. Grimm
*Attorney, Agent, or Firm*—D. R. Lackey

[57] ABSTRACT

A phase-locked loop having improved off-frequency detection. A variable frequency output signal is to be precisely locked to the frequency and phase of an alternating input signal. This is accomplished by alternately utilizing two feedback loops. A reference signal, having a frequency approximately equal to the frequency of the input signal is input to an initialization feedback loop in which it is mixed with the output signal. The initialization loop produces a feedback signal for controlling a voltage controlled oscillator which generates the output signal. An off-frequency detector detects the frequency difference between the output signal and the reference signal. When this frequency difference decreases below a predetermined level, the off-frequency detector disables the initialization feedback loop and enables a primary feedback loop. In the primary feedback loop the phase of the output signal is compared to the phase of the input signal, and the difference signal controls the voltage controlled oscillator in such a manner that the phase of the output signal tracks the phase of the input signal. With the scheme, the initialization loop, which has a wide bandwidth, is used to control the voltage controlled oscillator over a wide range of frequencies of the output signal (i.e., the initialization loop has a broad capture range). When the frequency of the output signal has been brought within the capture range of the primary loop, operation is switched to the primary loop. The primary loop has a narrower bandwidth and therefore provides better noise rejection than the initialization loop.

14 Claims, 4 Drawing Figures

PHASE-LOCKED LOOP HAVING IMPROVED LOCKING CAPABILITIES

BACKGROUND OF THE INVENTION

1. Field of the Invention

This invention relates generally to phase-locked loops for locking the phase of a variable-frequency output signal to the phase of an input signal, and specifically to such phase-locked loops capable of performing this locking function for any input signal having a frequency within a predetermined limit of a reference frequency.

2. Description of the Prior Art

Phase-locked loops are well known in the prior art. A phase-locked loop (hereinafter PLL) is used to synchronize, or lock, the phase and frequency of a locally produced variable-frequency output signal to the phase and frequency of an input signal. Typically, a PLL includes a phase comparator and a low-pass filter in a forward signal path, and a voltage-controlled oscillator (hereinafter VCO) for generating the output signal in a feedback path. The phase comparator is reponsive to the input and output signals. With no input signal present the phase comparator output is zero allowing the VCO to operate at a set frequency known as its free-running frequency. When an input signal is applied to the PLL, the phase comparator compares the phase and frequency of the input signal with the phase and frequency of the output signal and produces an error signal in response thereto. The error signal is filtered, amplified, and applied to the VCO. Since the frequency of the VCO signal is dependent on the voltage input thereto, the error signal forces the output signal frequency to vary in a direction to reduce the frequency difference between the input signal and the output signal.

Choosing the bandwidth of a PLL represents a critical design decision due to the significant effect of bandwidth on performance. Decreasing the PLL bandwidth slows the capture process, i.e., more time is required for the output signal to lock to the input signal. Also, the frequency range of input signals to which the output signal will lock decreases. However, a decreased bandwidth improves noise rejection characteristics of the PLL. Thus, the bandwidth chosen must represent a compromise between a narrow bandwidth providing high noise rejection and a wide bandwidth offering fast synchronization over a wide range of input frequencies.

U.S. Pat. No. 4,365,211 assigned to the assignee of the present invention, discloses means for overcoming this bandwidth choice dilemma. This patent discloses a phase-locked loop having two feedback loops: an initialization feedback loop for synchronizing a variable-frequency output signal to a reference signal, and a primary feedback loop for synchronizing the output signal to an input signal after the first-mentioned synchronization has been accomplished. A VCO, in cooperation with an integrator, produces the variable frequency output signal. The VCO and integrator are common components to both the primary and initialization loops. The primary loop has a narrow bandwidth and the initialization loop has a wide bandwidth; the reference signal has a frequency approximately equal to the frequency of the input signal. In operation, in the initialization loop the frequency of the reference signal is compared to the frequency of the output signal and an error signal is produced. An off-frequency detector is responsive to the error signal for producing a switching control signal having two states; the state of the switching control signal is dependent on the error signal. A switch, responsive to the switching control signal, selectively connects the initialization loop to the integrator and the VCO when the difference between the frequencies of the reference signal and the output signal is large. When this difference is small, the switch selectively connects the primary loop components to the integrator and the VCO. Thus, the wide bandwidth initialization loop adjusts the frequency of the output signal until it equals the frequency of the reference signal at which time the frequency of the output signal will be close to the frequency of the input signal. When this has been achieved, the primary loop with its narrow bandwidth is activated. Now the error signal represents the difference between the frequencies of the input signal and the output signal. The VCO is responsive to this error signal thereby allowing the output signal to precisely track the input signal. By providing dual operational modes, the invention offers the advantages of both a wide and a narrow-bandwidth PLL.

In actual operation it was discovered that the off-frequency detector of U.S. Pat. No. 4,365,211 sometimes improperly reactivated the initialization loop when the primary loop was operating, i.e., when the output signal was already locked to the input signal. This, of course, caused deactivation of the primary loop and loss of synchronism between the input and output signals. This problem occurred when the input signal was buried in noise. Phase jitter of the output signal, caused by the noise, falsely triggered the off-frequency detector, thereby activating the initialization loop. The present invention overcomes this problem, thus providing a phase-locked loop with improved locking capabilities for noisy input signals.

SUMMARY OF THE INVENTION

A phase-locked loop provides improved locking capabilities for a noisy input signal. The objective of the phase-locked loop is to synchronize the phase of a variable-frequency output signal to the phase of an input signal. Synchronization of the phase insures that the input and output signals have identical frequencies. A voltage-controlled oscillator produces the variable frequency output signal in cooperation with a primary feedback loop having a narrow bandwidth or an initialization feedback loop having a wide bandwidth. A reference signal has a frequency approximately equal to the frequency of the input signal. In the initialization feedback loop the frequency of the output signal is compared to the frequency of the reference signal for producing an error signal. The voltage-controlled oscillator is responsive to the error signal via a switch. The error signal causes the frequency of the output signal to change such that the frequency of the output signal equals the frequency of the reference signal. When the frequencies of the output signal and the reference frequency differ by less than a predetermined limit, an off-frequency detector causes the switch to change states. Now the voltage-controlled oscillator is responsive to a phase detector of the primary feedback loop. The phase detector compares the frequencies of the output signal and the input signal to produce a signal representative of the difference between the frequencies of the output signal and the input signal. The output signal is input to the voltage-controlled oscillator, via the switch, for precisely locking the frequency and phase of the output signal to the frequency and phase of the input signal. The off-frequency detector will not erroneously reactivate the initialization loop (and deactivate the primary loop) when the output signal experiences phase jitter caused by a noisy input signal. The present invention can therefore produce an output signal which accurately tracks an input signal even if the latter is buried in noise.

DESCRIPTION OF THE PREFERRED EMBODIMENT

Positive logic and a positive ground are utilized throughout the descriptions of FIGS. 1, 2, 3, and 4. Thus a binary one is represented by ground potential and a binary zero is represented by a negative potential.

Figure 1:
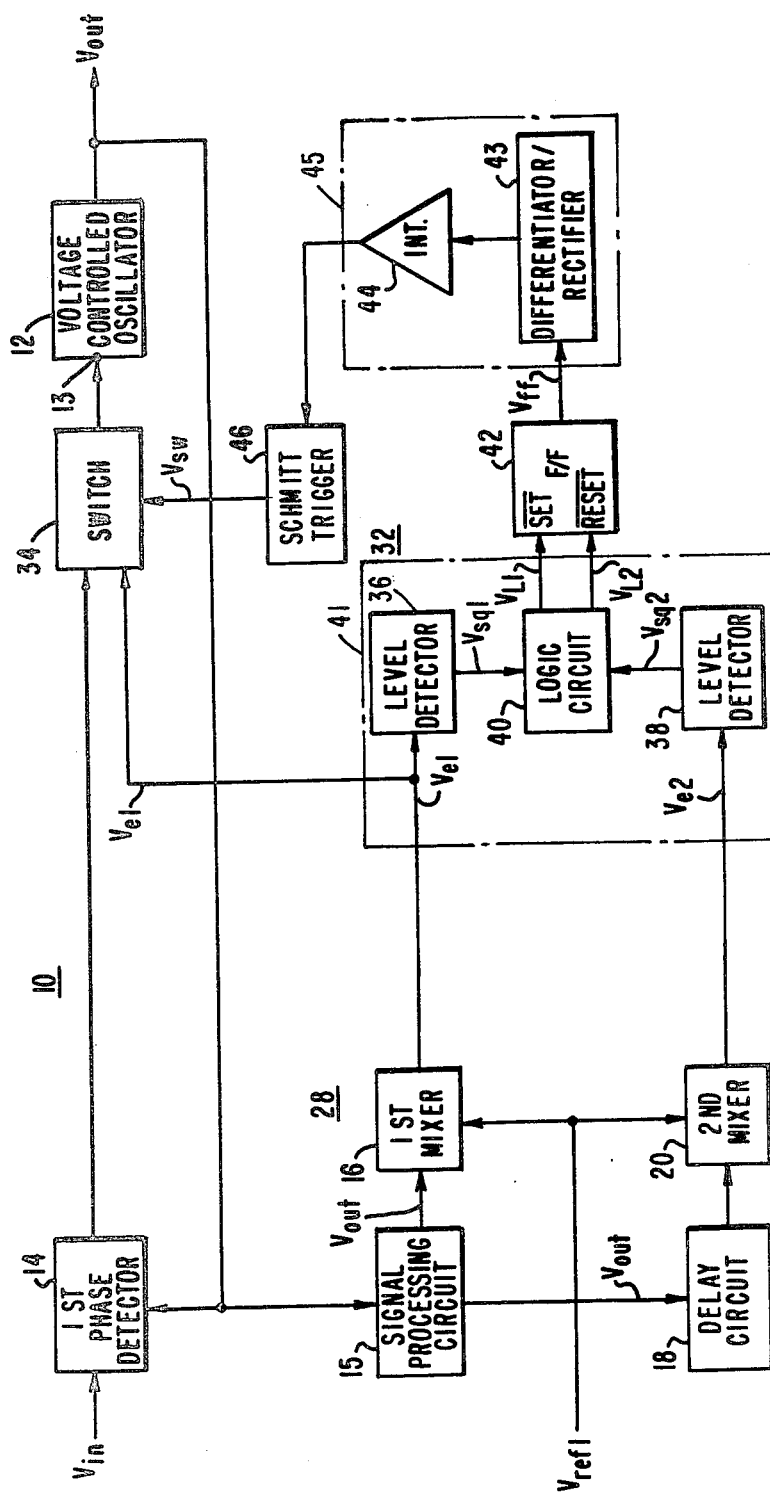
FIG. 1 is a block diagram of a first embodiment phase-locked loop constructed according to the teachings of the present invention.

Referring to FIG. 1, there is shown a phase-locked loop 10 for producing an output signal, $V_{out}$, having a phase (and therefore frequency) locked to the phase of an input signal, $V_{in}$. $V_{out}$ is produced by a voltage-controlled oscillator 12 wherein the frequency and phase of $V_{out}$ are determined by a control voltage applied to an input terminal 13 of the voltage-controlled oscillator 12. The control voltage is provided by the selective operation of one of two feedback loops: a primary feedback loop, consisting of a first phase detector 14, and an initialization feedback loop, consisting of a second phase detector 28. In response to an off-frequency detector 32 which is responsive to the second phase detector 28, a switch 34 determines which of the two feedback loops is operative to control the voltage-controlled oscillator 12 at the input terminal 13 thereof. The initialization feedback loop operates when the frequency difference between $V_{out}$ and $V_{in}$ is above a predetermined limit. The initialization feedback loop has a wide bandwidth to provide a broad capture range, i.e., the range of frequencies over which $V_{out}$ can be locked to a reference frequency approximating $V_{in}$. The primary feedback loop has a narrow bandwidth to provide improved noise rejection for the phase-locked loop 10 and operates when the frequency difference between $V_{out}$ and $V_{in}$ is below the predetermined limit.

As can be seen in FIG. 1, in the primary feedback loop $V_{out}$ is input to the first phase detector 14. The first phase detector 14 is also responsive to $V_{in}$ to detect a phase difference between $V_{out}$ and $V_{in}$. The first phase detector 14 produces a difference signal in response to the phase difference; the difference signal is selectively input to the voltage-controlled oscillator 12 at the input terminal 13, via the switch 34, for controlling the frequency and phase of $V_{out}$ only when the difference between the frequency of $V_{out}$ and the frequency of $V_{in}$ is below the predetermined limit. Operation of the switch 34 will be discussed in greater detail hereinafter.

In the initialization feedback loop $V_{out}$ is input to the second phase detector 28. Within the second phase detector 28, $V_{out}$ is input to a first mixer 16 and a delay circuit 18. A second mixer 20 is responsive to the delay circuit 18. The first mixer 16 and the second mixer 20 are also responsive to a first reference signal designated $V_{ref1}$. The first mixer 16, the delay circuit 18, and the second mixer 20 constitute the second phase detector 28.

The second phase detector 28 detects a phase difference between $V_{out}$ and $V_{ref1}$; the frequency of $V_{ref1}$ is approximately equal to the frequency of $V_{in}$. The second phase detector 28 produces a signal $V_{e1}$ (see FIG. 1) representative of the difference between the frequency of $V_{ref1}$ and the frequency of $V_{out}$. $V_{e1}$ is selectively input to the voltage-controlled oscillator 12 at the input terminal 13, via the switch 34, for controlling the frequency and phase of $V_{out}$ when the disparity between the frequency of $V_{out}$ and the frequency of $V_{ref1}$ is above the predetermined limit.

Figure 3:
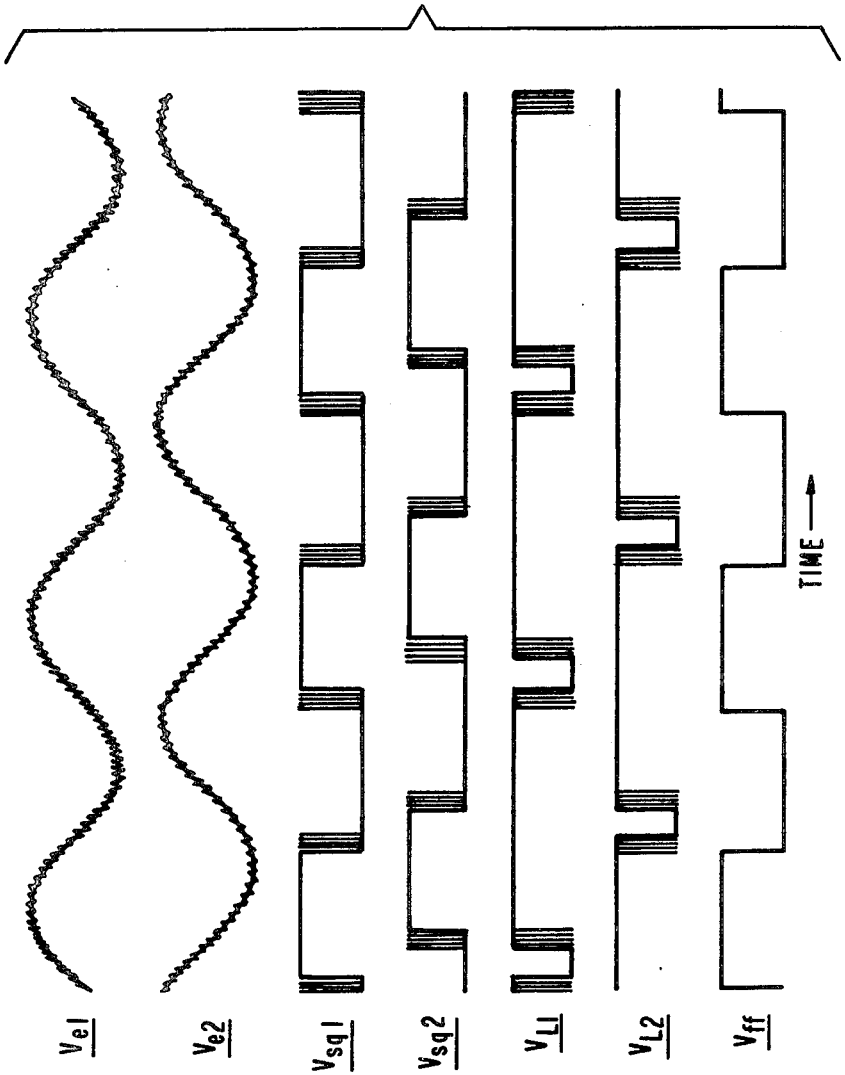
FIG. 3 is a timing diagram showing the temporal relationships of the various signals depicted in FIG. 1.

The operation of the second phase detector 28 is as follows. The first mixer 16 determines the frequency difference between $V_{ref1}$ and $V_{out}$ and produces the first error signal, $V_{e1}$, representative of the frequency difference between the mixed signals. The delay circuit 18, which is responsive to $V_{out}$, slightly delays and inverts $V_{out}$. The delayed and inverted $V_{out}$ signal and $V_{ref1}$ are mixed in the second mixer 20 producing a second error signal, $V_{e2}$, representative of the frequency difference between the mixed signals. The signals $V_{e1}$ and $V_{e2}$ are both low frequency slightly distorted sine waves representative of the frequency difference between $V_{ref1}$ and $V_{out}$. $V_{e2}$ is approximately 180 degrees out of phase with $V_{e1}$. $V_{e1}$ and $V_{e2}$ are illustrated in FIG. 3.

In one embodiment of the present invention $V_{in}$ has a frequency close to 5.2 MHz; $V_{ref1}$ has an extremely precise frequency of 5.2 MHz. Also, note that the delay circuit 18 functions solely to impart a phase difference and inversion between $V_{e1}$ and $V_{e2}$. Therefore, in another embodiment the delay circuit 18 can be repositioned such that $V_{ref1}$ is input thereto and the first mixer 16 is responsive to the output of the delay circuit 18. In this embodiment the second mixer 20 is responsive to $V_{out}$.

Continuing with a description of the off-frequency detector 32 in FIG. 1, a level detector 36 is responsive to $V_{e1}$ and produces a square wave signal $V_{sq1}$; a level detector 38 is responsive to $V_{e2}$ and produces a square wave signal $V_{sq2}$. $V_{sq1}$ and $V_{sq2}$ are combined in a logic circuit 40 which produces two output signals, $V_{L1}$ and $V_{L2}$. The level detectors 36 and 38 and the logic circuit 40 constitute a logic means 41. An inverting set input terminal of a flip-flop 42 is responsive to $V_{L1}$; an inverting reset input terminal of the flip-flop 42 is responsive to $V_{L2}$. The flip-flop 42 produces a square wave designated $V_{ff}$. $V_{ff}$ is input to a differentiator/rectifier 43. An integrator 44 is responsive to an output terminal of the differentiator/rectifier 43, and a Schmitt trigger 46 is responsive to an output terminal of the integrator 44. The Schmitt trigger 46 produces the switching signal, $V_{sw}$, for controlling the switch 34. The differentiator/rectifier 43 and the integrator 44 constitute a frequency detector 45. The level detectors 36 and 38, the logic circuit 40, the flip-flop 42, the differentiator/rectifier 43, the integrator 44, and the Schmitt trigger 46 constitute the off-frequency detector 32.

Operation of the off-frequency detector 32 is as follows. The level detector 36 converts the sine wave signal $V_{e1}$ to a square wave signal $V_{sq1}$. $V_{sq1}$ may have chatter on the leading and trailing edges of each pulse if $V_{out}$ is distorted by phase jitter. The phase jitter is present when $V_{in}$ is noisy. Both signals $V_{e1}$ and $V_{sq1}$ are illustrated in FIG. 3. The level detector 38 produces a square wave signal $V_{sq2}$ in response to $V_{e2}$. Like $V_{sq1}$, $V_{sq2}$ may have jitter on the leading and trailing edges of each pulse; $V_{sq2}$ is also shown in the FIG. 3 timing diagram. The phase difference between $V_{e1}$ and $V_{e2}$ in maintained in processing through the level detectors 36 and 38, but the inverse relationship is lost. Therefore, $V_{sq1}$ is only slightly out of phase with $V_{sq2}$.

As discussed above, the chatter associated with the pulses of $V_{sq1}$ and $V_{sq2}$ can cause improper operation of the off-frequency detector 32 by causing the switching signal $V_{sw}$ to change states incorrectly. For example, the chatter can cause activation of the initialization loop, and deactivation of the primary loop when $V_{out}$ is already synchronized with $V_{in}$. The logic circuit 40 and the flip-flop 40 eliminate this problem.

Within the logic circuit 40, $V_{L1}$ and $V_{L2}$ are produced by arithmetic operations on $V_{sq1}$ and $V_{sq2}$. $V_{L1}$ is the logical sum of $V_{sq2}$ and the inverse of $V_{sq1}$. $V_{L1}$ is present at the first output terminal of logic circuit 40 and input to the inverting set input terminal of the flip-flop 42. $V_{L2}$ is the logical sum of $V_{sq1}$ and the inverse of $V_{sq2}$. $V_{L2}$ is provided at the second output terminal of logic circuit 40 and input to the inverting reset terminal of the flip-flop 42. Both $V_{L1}$ and $V_{L2}$ are shown in FIG. 3. Through the action of the flip-flop 42, $V_{L1}$ and $V_{L2}$ are converted to a square wave signal ($V_{ff}$) having no chatter on either the leading or the trailing edges. See FIG. 3. Once a transition of $V_{ff}$ has occurred, $V_{ff}$ cannot make a subsequent transition unless $V_{out}$ undergoes an additional 180° phase shift (either plus or minus). Phase jitter on $V_{out}$, induced by leading-edge and trailing-edge chatter in $V_{sq1}$ and $V_{sq2}$ has, therefore, been eliminated because it is unlikely $V_{out}$ will contain jitter components with magnitude sufficient to cause a 180° phase shift.

The frequency of $V_{ff}$ represents the difference between the frequency of $V_{out}$ and the frequency of $V_{ref1}$. In response to $V_{ff}$ the differentiator/rectifier 43 produces a current pulse for each positive transition of $V_{ff}$; the integrator 44 integrates the current pulses. The integrator 44 is a frequency-to-voltage converter circuit that is insensitive to noise because the integrator 44 integrates over a long period. Occasional false transitions in $V_{ff}$ do not significantly contribute to the long-term average and will therefore not cause erroneous state changes in $V_{sw}$. An output signal of the integrator 44 is input to the Schmitt trigger 46. When the output signal of the integrator 44 exceeds the trip voltage threshold of the Schmitt trigger 46 $V_{sw}$ goes high. When the frequency of $V_{out}$ is made equal to the frequency of $V_{ref1}$ the output signal of the integrator 44 is below the trip threshold of the Schmitt trigger 46 and $V_{sw}$ will fall to a low state.

A first input terminal of the switch 34 is responsive to $V_{e1}$. A second input terminal of the switch 34 is responsive to the output signal from the first phase detector 14. An output terminal of the switch 34 is selectively responsive to $V_{e1}$ and the output signal from the first phase detector 14. The input terminal 13 of the voltage-controlled oscillator 12 is responsive to the output terminal of the switch 34. The switching signal, $V_{sw}$, produced by the off-frequency detector 32 and input to the switch 34 at a third input terminal thereof determines which of the two input signals to the switch 34 is connected to the output terminal thereof. When $V_{sw}$ is in the high state the first input terminal (i.e., $V_{e1}$) of the switch 34 is connected to the output terminal thereof. The high state of $V_{sw}$ indicates a divergence between the frequency of $V_{out}$ and the frequency of $V_{ref1}$ in excess of the predetermined limit. This causes the initialization feedback loop to be operative. In this mode $V_{e1}$ is input to the voltage controlled oscillator 12, via the switch 34, to equalize the frequency of $V_{out}$ to the frequency of $V_{ref1}$. When $V_{sw}$ is in the low state the second input terminal (i.e., the output signal from the first phase detector 14) of the switch 34 is connected to the output terminal thereof. The low state of $V_{sw}$ indicates that the frequency of $V_{out}$ equals the frequency of $V_{ref1}$ such that the primary feedback loop can be activated to precisely synchronize $V_{out}$ with $V_{in}$. Now, the output signal from the first phase detector 14 is input to the voltage-controlled oscillator 12, via the switch 34, to perform the synchronization of $V_{out}$ with $V_{in}$.

In another embodiment of the present invention the output signal of the first phase detector 14 can be permanently connected to the voltage-controlled oscillator 12. Because the output signal of the first phase detector 14 is at a lower level than $V_{e1}$, the former does not interfere with the initialization process. In this embodiment the switch 34 is utilized only to connect and disconnect $V_{e1}$ from the input terminal 13 of the voltage-controlled oscillator 12.

Figure 2:
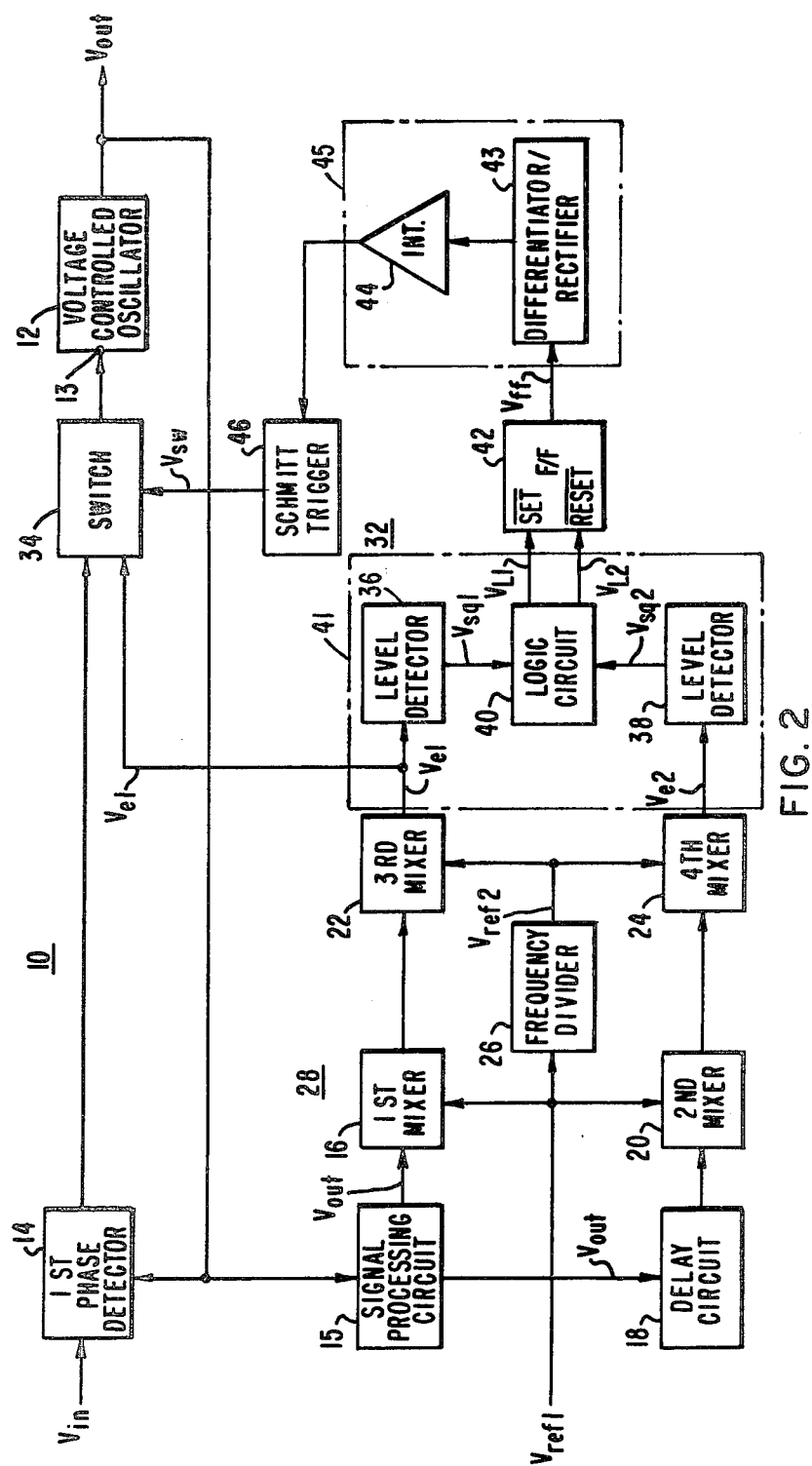
FIG. 2 is a block diagram of a second embodiment of a phase-locked loop constructed according to the teachings of the present invention.

Turning to FIG. 2, there is shown a second embodiment of a phase-locked loop 10 constructed according to the teachings of the present invention. The components of FIG. 2 are identical in structure and function to the components bearing identical reference characters in FIG. 1. The embodiment of FIG. 2 includes a signal processing circuit 15 disposed between the voltage controlled oscillator 12 and the first mixer 16. A third mixer 22 is disposed between the first mixer 16 and the level detector 36; a fourth mixer 24 is disposed between the second mixer 20 and the level detector 38. A frequency divider 26 is also responsive to $V_{ref1}$ for producing a second reference signal designated $V_{ref2}$. In the embodiment of FIG. 2, the signal processing circuit 15, the first mixer 16, the third mixer 22, the delay circuit 18, the second mixer 20, the fourth mixer 24, and the frequency divider 26 constitute the second phase detector 28.

The second phase detector 28 detects a phase difference between $V_{out}$ and $V_{ref1}$ plus $V_{ref2}$; the frequency of $V_{ref1}$ plus the frequency of $V_{ref2}$ is approximately equal to the frequency of $V_{in}$. The second phase detector 28 produces the signal $V_{e1}$ representative of the difference between the frequency of $V_{ref1}$ plus the frequency of $V_{ref2}$ and the frequency of $V_{out}$. Like the embodiment of FIG. 1, signal $V_{e1}$ is selectively input to the voltage-controlled oscillator 12 at the input terminal 13, via the switch 34, for controlling the frequency and phase of $V_{out}$ when the disparity between the frequency of $V_{out}$ and the frequency of $V_{ref1}$ plus the frequency of $V_{ref2}$ is above the predetermined limit.

Note that the embodiment of FIG. 2 utilizes four mixers, rather than two mixers as shown in the FIG. 1 embodiment. This is due to the availability of an extremely precise frequency of 5 MHz for $V_{ref1}$ when $V_{in}$ is approximately 5.2 MHz. $V_{ref2}$ is obtained by dividing $V_{ref1}$ by twenty-five (in the frequency divider 26) producing $V_{ref2}$ with a frequency of 200 kHz. Thus, the frequency of $V_{ref1}$ plus $V_{ref2}$ equals $V_{in}$. The mixing of $V_{out}$ and the reference signal is performed in two stages (i.e., the first stage consisting of the first mixer 16 and the second mixer 20, the second stage consisting of the third mixer 26 and the fourth mixer 24) due to the availability of an extremely accurate 5 MHz source. The result obtained is identical to mixing $V_{in}$ with a signal of 5.2 MHz in a single mixing stage. In other embodiments, more than two mixing stages or a single mixing stage (see FIG. 1) may be used depending on the frequencies involved and the availability of accurate frequency sources.

The operation of the second phase detector 28, as depicted in FIG. 2, is as follows. Note first that the frequency of $V_{ref1}$ is divided by the frequency divider 26 to produce $V_{ref2}$. The first mixer 16 determines the frequency difference between $V_{ref1}$ and $V_{out}$ and produces an output signal representative thereof. In the third mixer 22, $V_{ref2}$ and the output signal from the first mixer 16 are mixed to produce the first error signal, $V_{e1}$, representative of the frequency difference between the mixed signals. The delay circuit 18, slightly delays and inverts $V_{out}$. The delayed and inverted $V_{out}$ signal and $V_{ref1}$ are mixed in the second mixer 20 producing an output signal representative of the frequency difference between the mixed signals. The fourth mixer 24 produces a second error signal, $V_{e2}$, representative of the difference between the frequency of the signal from the second mixer 20 and $V_{ref2}$. The signals $V_{e1}$ and $V_{e2}$ are both low frequencies slightly distorted sine waves representative of the frequency difference between $V_{ref1}$ pus $V_{ref2}$ and $V_{out}$. $V_{e2}$ is approximately 180° out of phase with $V_{e1}$. $V_{e1}$ and $V_{e2}$ are illustrated in FIG. 3. From this point, operation of the phase-locked loop 10 of FIG. 2 is identical to that described in conjunction with FIG. 1.

Figure 4:
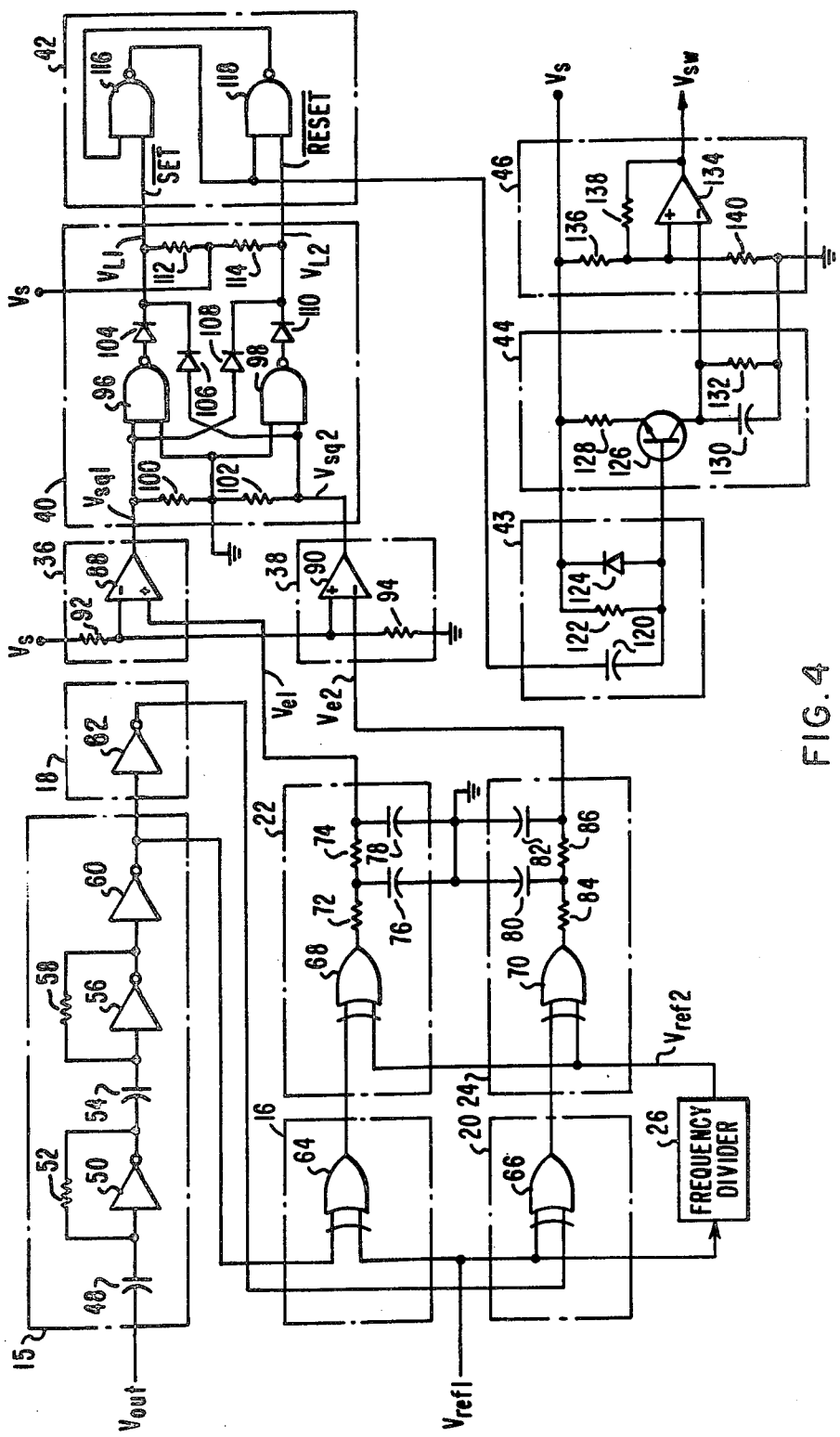
FIG. 4 is an electrical schematic illustrating selected portions of the phase-locked loop of FIG. 2.

Turning now to FIG. 4, there is shown a schematic diagram of the second phase detector 28 (as illustrated in FIG. 2) and the off-frequency detector 32. A first terminal of a capacitor 48 is responsive to $V_{out}$; a second terminal of the capacitor 48 is connected to an input terminal of an inverter 50. An output terminal of the inverter 50 is connected to an input terminal of an inverter 56 via a capacitor 54. The output terminal of the inverter 50 is also connected to the input terminal thereof via a resistor 52. An output terminal of the inverter 56 is connected to an input terminal of an inverter 60. The output terminal of the inverter 56 is also connected to the input terminal thereof via a resistor 58. The inverters 50, 56 and 60, and the associated resistors and capacitors constitute the signal processing circuit 15 of the second phase detector 28. The signal processing circuit 15 converts the analog signal $V_{out}$ to a digital signal suitable for processing through the digital circuitry of the phase-locked loop 10. An output terminal of the inverter 60 is connected to an input terminal of an inverter 62. The inverter 62, which constitutes the delay circuit 18, not only delays $V_{out}$, but also inverts $V_{out}$. The result, as previously noted, is that $V_{e2}$ is approximately 180 degrees out of phase with $V_{e1}$. As will be explained subsequently, a re-invention occurs within the level detector 38 to impart the proper polarity relationship to $V_{sq1}$ and $V_{sq2}$.

The output terminal of the inverter 60 is connected to a first input terminal of an EXCLUSIVE OR gate 64. A second input terminal of the EXCLUSIVE OR gate 64 is responsive to the first reference signal $V_{ref1}$. The EXCLUSIVE OR gate 64 constitutes the first mixer 16. An output terminal of the inverter 62 is connected to a first input terminal of an EXCLUSIVE OR gate 66; a second input terminal of the EXCLUSIVE OR gate 66 is responsive to $V_{ref1}$. The EXCLUSIVE OR gate 66 constitutes the second mixer 20 of the second phase detector 28. Since the output signal of an EXCLUSIVE OR gate is a binary one only if the input signals are unequal, an EXCLUSIVE OR gate can be utilized as a detector whereby the EXCLUSIVE OR gate output signal's frequency equals the difference between the frequencies of the signals at the input terminals thereof. EXCLUSIVE OR gates 64 and 66 are used in this manner.

An output terminal of the EXCLUSIVE OR gate 64 is connected to a first input terminal of an EXCLUSIVE OR gate 68. A second input terminal of the EXCLUSIVE OR gate 68 is responsive to $V_{ref2}$, produced by the frequency divider 26. An output terminal of the EXCLUSIVE OR gate 66 is connected to a first input terminal of an EXCLUSIVE OR gate 70. A second input terminal of the EXCLUSIVE OR gate 70 is responsive to $V_{ref2}$. EXCLUSIVE OR gates 68 and 70 also function as frequency detectors.

An output terminal of the EXCLUSIVE OR gate 68 is connected to a non-inverting input terminal of an operational amplifier 88 via a series combination of a resistor 72 and a resistor 74. An output terminal of the EXCUSIVE OR gate 70 is connected to an inverting input terminal of an operational amplifier 90 via a series combination of a resistor 84 and a resistor 86. The junction between the resistor 72 and the resistor 74 is connected to ground via a capacitor 76; the junction between the resistor 84 and the resistor 86 is also connected to ground via a capacitor 80. The junction between resistor 74 and the non-inverting input terminal of the operational amplifier 88 is connected to ground via a capacitor 78; the junction between the resistor 86 and the inverting input terminal of the operational amplifier 90 is connected to ground via a capacitor 82. The EXCLUSIVE OR gate 68 and the resistors and capacitors associated therewith constitute the third mixer 22. The EXCLUSIVE OR gate 70 with the associated resistors and capacitors constitute the fourth mixer 24.

Note that the signal supplied to the non-inverting input terminal of the operational amplifier 88 is $V_{e1}$ discussed in conjunction with FIGS. 1 and 2, and the signal applied to the inverting input terminal of the operational amplifier 90 is $V_{e2}$ discussed in conjunction with FIGS. 1 and 2. Since $V_{e2}$ is applied to the inverting input terminal of the operational amplifier 90 and $V_{e1}$ is applied to the non-inverting input terminal of the operational amplifier 88, $V_{e2}$ is inverted with respect to $V_{e1}$. This inversion compensates for the previously discussed inversion associated with the inverter 62 (i.e., the delay circuit 18).

An inverting input terminal of the operational amplifier 88 is connected to a power supply voltage $V_s$ via a resistor 92 and connected to ground via a resistor 94. The junction between the resistor 94 and the inverting input terminal of the operational amplifier 88 is connected to a non-inverting input terminal of the operational amplifier 90. The operational amplifier 88 and the resistor associated therewith constitute the level detector 36. The level detector 38 is comprised of the operational amplifier 90 and the resistor 94.

The signal $V_{sq1}$ is present at an output terminal of the operational amplifier 88; a first input terminal of a NAND gate 96 is responsive to $V_{sq1}$. A second input terminal of the NAND gate 96 is connected to ground. The first input terminal of the NAND gate 96 is also connected to ground via a resistor 100 and is connected to an anode terminal of a diode 108.

The operational amplifier 90 produces a signal $V_{sq2}$ at an output terminal thereof. A first input terminal of a NAND gate 98 is responsive to $V_{sq2}$. A second input terminal of the NAND gate 98 is connected to ground. The first input terminal of the NAND gate 98 is also connected to ground via a resistor 102 and is connected to an anode terminal of a diode 106.

An output terminal of the NAND gate 96 is connected to an anode terminal of a diode 104; a cathode terminal of the diode 104 is connected to a cathode terminal of the diode 106. An output terminal of the NAND gate 98 is connected to an anode terminal of a diode 110; a cathode terminal of the diode 110 is connected to a cathode terminal of the diode 108. The junction between the diodes 104 and 106 is connected to the power supply voltage $V_s$ via a resistor 112. A junction between the diodes 108 and 110 is connected to the power supply voltage $V_s$ via a resistor 114. The NAND gates 96 and 98, the diodes 104, 106, 108, and 110, and the associated resistors constitute the logic circuit 40 of the off-frequency detector 32. The signal at the junction between the diodes 104 and 106 is referred to as $V_{L1}$ in FIGS. 1 and 2. The signal at the junction between the diodes 108 and 110 is referred to as $V_{L2}$ in FIGS. 1 and 2.

A first input terminal of a NAND gate 116 is responsive to $V_{L1}$, and a first input terminal of a NAND gate 118 is responsive to $V_{L2}$. A second input terminal of the NAND gate 116 is connected to an output terminal of the NAND gate 118. A second input terminal of the NAND gate 118 is connected to an output terminal of the NAND gate 116. The NAND gates 116 and 118 constitute the flip-flop 42 of the off-frequency detector 32. The first input terminal of the NAND gate 116 is referred to as the inverting set input terminal of the flip-flop 42 in FIGS. 1 and 2; the first input terminal of the NAND gate 118 is referred to as the inverting reset input terminal of the flip-flop 42 in FIGS. 1 and 2.

The signal at the output terminal of the NAND gate 116 is designated $V_{ff}$ in FIGS. 1 and 2. A first terminal of capacitor 120 is responsive to $V_{ff}$. A second terminal of the capacitor 120 is connected to the power supply voltage $V_s$ via a parallel combination of a resistor 122 and a diode 124 such that the cathode terminal of the diode 124 is connected to the power supply voltage $V_s$. The second terminal of the capacitor 120 is also connected to a base terminal of a transistor 126. A collector terminal of the transistor 126 is connected to the power supply voltage $V_s$ via a resistor 128. An emitter terminal of the transistor 126 is connected to ground via a parallel combination of a capacitor 130 and a resistor 132. The capacitor 120, the resistor 122 and the diode 124 constitute the differentiator/rectifier 43; the transistor 126 and the associated resistors and capacitor constitute the integrator 44.

The emitter terminal of the transistor 126 is also connected to an inverting input terminal of an operational amplifier 134. A non-inverting input terminal of the operational amplifier 134 is connected to ground via a resistor 140 and is connected to the power supply voltage $V_s$ via a resistor 136. An output terminal of the operational amplifier 134 is connected to the non-inverting input terminal thereof via a resistor 138. The switching signal $V_{sw}$ discussed in detail in conjunction with FIGS. 1 and 2 is provided at the output terminal of the operational amplifier 134. The Schmitt trigger 46 of the off-frequency detector 32 comprises the operational amplifier 134 and the associated resistors. As discussed in conjunction with FIG. 2, when the output terminal of the operational amplifier 134 is in a high state, the initialization feedback loop is operative to equalize the frequency of $V_{out}$ to the sum of the frequencies of $V_{ref1}$ plus $V_{ref2}$. When the output terminal of the operational amplifier 134 is in a low state, the primary feedback loop will be operative to precisely synchronize the phase of $V_{out}$ to the phase of $V_{in}$.

What is claimed is:

1. A phase-locked loop having improved off-frequency detection, comprising:
   means providing an alternating input signal;
   oscillator means providing an output signal having a frequency and phase to be locked to the frequency and phase of said alternating input signal;
   means providing a first reference signal;
   first mixer means for mixing said output signal and said first reference signal and for producing a first mixed signal in response thereto;
   delay means responsive to said output signal for producing a delayed signal representative of said output signal and delayed in time;
   second mixer means for mixing said delay signal and said first reference signal and for producing a second mixed signal in response thereto, wherein said second mixed signal is delayed with respect to said first mixed signal;
   logic means for logically relating said first and said second mixed signals and for producing first and second logic signals in response thereto;
   flip-flop means providing a flip-flop signal in response to said first and said second logic signals with the frequency of said flip-flop signal representing the difference between the frequency of said output signal and the frequency of said first reference signal;
   frequency detector means responsive to said flip-flop signal for producing an error signal representative of the frequency of said flip-flop signal;
   threshold detector means responsive to said error signal for producing a switching signal, wherein said switching signal is in a first state when said error signal exceeds a predetermined value and in a second state when said predetermined value is not exceeded;
   phase detector means for detecting a phase difference between said output and said input signals, and for producing a difference signal in response thereto, said phase detector means having a narrow bandwidth;
   and switching means selectively connecting said difference signal and said first mixed signal to said oscillator means for controlling the frequency and phase of said variable frequency output signal, said switching means responsive to said switching signal such that when said predetermined value is exceeded said first mixed signal is input to said oscillator means, and when said predetermined value is not exceeded said difference signal is input to said oscillator means.

2. The phase-locked loop of claim 1 wherein the frequency of the first reference signal is approximately equal to the frequency of the input signal.

3. The phase-locked loop of claim 1 wherein the frequency of the first mixed signal is equal to the frequency of the output signal less the frequency of the first reference signal.

4. The phase-locked loop of claim 1 wherein the frequency of the second mixed signal is equal to the frequency of the output signal less the frequency of the first reference signal.

5. The phase-locked loop of claim 1 wherein the delay means includes an inverting buffer device.

6. The phase-locked loop of claim 1 wherein the first mixer means includes an EXCLUSIVE OR gate having a first input terminal responsive to the output signal, a second input terminal responsive to the first reference signal, and an output terminal, and wherein the logic means is responsive to said output terminal.

7. The phase-locked loop of claim 1 wherein the second mixer means includes an EXCLUSIVE OR gate having a first input terminal responsive to the output signal, a second input terminal responsive to the first reference signal, and an output terminal, and wherein the logic means is responsive to said output terminal.

8. The phase-locked loop of claim 1 including:
means for producing a second reference signal, wherein the frequency of the first reference signal plus the frequency of said second reference signal is approximately equal to the frequency of the input signal;
third mixer means disposed between the first mixer means and the logic means, for mixing said first mixed signal and said second reference signal and for producing a third mixed signal in response thereto, wherein the logic means is responsive to said third mixed signal;
and fourth mixer means disposed between the second mixer means and the logic means for mixing the second mixed signal and said second reference signal and for producing a fourth mixed signal in response thereto, wherein the logic means is responsive to said fourth mixed signal.

9. The phase-locked loop of claim 8 wherein the third mixer means includes an EXCLUSIVE OR gate having a first input terminal responsive to the first mixed signal, a second input terminal responsive to the second reference signal, and an output terminal, and wherein the third mixed signal is produced at said output terminal, and wherein the fourth mixer means includes an EXCLUSIVE OR gate having a first input terminal responsive to the second mixed signal, a second input terminal responsive to the second reference signal, and an output terminal, and wherein the fourth mixed signal is produced at said output terminal.

10. The phase-locked loop of claim 1 wherein the logic means includes:
first level detector means responsive to the first mixed signal for transforming the first mixed signal to a first square wave signal;
second level detector means responsive to the second mixed signal for transforming the second mixed signal to a second square wave signal;
first inverter means responsive to said first square wave signal for producing a first inverted signal;
second inverter means responsive to said second square wave signal for producing a second inverted signal;
first summing means for producing the first logic signal wherein the first logic signal is representative of the logical sum of said first inverted signal and said second square wave signal;
second summing means for producing the second logic signal wherein the second logic signal is representative of the logical sum of said second inverted signal and said first mixed signal.

11. The phase-locked loop of claim 1 wherein the flip-flop means includes an S-R type flip-flop having an inverting set input terminal responsive to the first logic signal, and an inverting reset input terminal responsive to the second logic signal.

12. The phase-locked loop of claim 1 wherein the frequency detector means includes frequency-to-voltage converter means for producing the error signal representative of the frequency of the flip-flop signal.

13. The phase-locked loop of claim 1 wherein the threshold detector means includes a Schmitt trigger responsive to the error signal for producing the switching signal.

14. A phase-locked loop having improved off-frequency detection, comprising:
means providing an alternating input signal;
oscillator means providing an output signal having a frequency and phase to be locked to the frequency and phase of said alternating input signal;
means providing a first reference signal;
frequency divider means responsive to said first reference signal for producing a second reference signal wherein the frequency of said first reference signal plus the frequency of said second reference signal is approximately equal to the frequency of said input signal;
a first EXCLUSIVE OR gate for mixing said output signal and said first reference signal and for producing a first mixed signal in response thereto, said first mixed signal having a frequency equal to the frequency of said output signal less the frequency of said first reference signal;
a second EXCLUSIVE OR gate for mixing said first mixed signal and said second reference signal and for producing a second mixed signal in response thereto, said second mixed signal having a frequency equal to the frequency of said first mixed signal less the frequency of said second reference signal;
delay means responsive to said output signal for producing a delayed signal representative of said output signal and delayed in time;
a third EXCLUSIVE OR gate for mixing said delayed signal and said first reference signal and for producing a third mixed signal in response thereto, said third mixed signal having a frequency equal to the frequency of said delayed signal less the frequency of said first reference signal;
a fourth EXCLUSIVE OR gate for mixing said third mixed signal and said second reference signal and for producing a fourth mixed signal in response thereto, said fourth mixed signal having a frequency equal to the frequency of said third mixed signal less the frequency of said second reference signal;
first level detector means responsive to said second mixed signal for transforming said second mixed signal to a first square wave signal;
second level detector means responsive to said fourth mixed signal for transforming said fourth mixed signal to a second square wave signal;
first inverter means responsive to said first square wave signal for producing a first inverted signal;
first summing means for determining the logical sum of said first inverted signal and said second square wave signal and for producing a first logic signal;

second inverter means responsive to said second square wave signal for producing a second inverted signal;

second summing means for determining the logical sum of said second inverted signal and said first square wave signal and for producing a second logic signal;

S-R flip-flop means having an inverting set input terminal responsive to said first logic signal and an inverting reset input terminal responsive to said second logic signal for producing a flip-flop signal in response thereto, with the frequency of said flip-flop signal representing the difference between the frequency of said output signal and the sum of the frequencies of said first and said second reference signals;

frequency detector means for producing an error signal in response to said flip-flop signal with said error signal representing the frequency of said flip-flop signal;

a Schmitt trigger responsive to said error signal for producing a switching signal, wherein said switching signal is in a first state when said error signal exceeds a predetermined value and in a second state when said predetermined value is not exceeded;

phase detector means for detecting a phase difference between said output and said input signals, and for producing a difference signal in response thereto, said phase detector means having a narrow bandwidth;

and switching means selectively connecting said difference signal and said third mixed signal to said oscillator means for controlling the frequency and phase of said variable frequency output signal, said switching means responsive to said switching signal such that when said predetermined value is exceeded said third mixer means is connected to said oscillator means, and when said predetermined value is not exceeded said phase detector means is connected to said oscillator means.

* * * * *